(12) United States Patent
Tatsumi et al.

(10) Patent No.: US 11,810,885 B2
(45) Date of Patent: Nov. 7, 2023

(54) SEMICONDUCTOR ELEMENT BONDING STRUCTURE, METHOD FOR PRODUCING SEMICONDUCTOR ELEMENT BONDING STRUCTURE, AND ELECTRICALLY CONDUCTIVE BONDING AGENT

(71) Applicant: WASEDA UNIVERSITY, Tokyo (JP)

(72) Inventors: Kohei Tatsumi, Tokyo (JP); Yasunori Tanaka, Tokyo (JP)

(73) Assignee: WASEDA UNIVERSITY, Tokyo (JP)

( * ) Notice: Subject to any disclaimer, the term of this patent is extended or adjusted under 35 U.S.C. 154(b) by 0 days.

(21) Appl. No.: 17/187,452

(22) Filed: Feb. 26, 2021

(65) Prior Publication Data

US 2021/0225794 A1    Jul. 22, 2021

Related U.S. Application Data

(63) Continuation of application No. PCT/JP2019/032599, filed on Aug. 21, 2019.

(30) Foreign Application Priority Data

Aug. 31, 2018 (JP) ................................ 2018-163838

(51) Int. Cl.
  *H01L 23/00* (2006.01)
  *H01L 23/495* (2006.01)
(52) U.S. Cl.
  CPC .............. *H01L 24/29* (2013.01); *H01L 24/32* (2013.01); *H01L 24/83* (2013.01);
  (Continued)
(58) Field of Classification Search
  None
  See application file for complete search history.

(56) References Cited

U.S. PATENT DOCUMENTS 4,069,369 A * 1/1978 Fedor ...................... B22F 7/02
                                                        428/548
4,734,967 A * 4/1988 Bryda ...................... B22F 3/24
                                                        419/29

(Continued)

FOREIGN PATENT DOCUMENTS

EP        3327766 A1 *  5/2018 ............. H01L 23/15
JP     2004128465 A  *  4/2004 ......... C08G 18/0823

(Continued)

OTHER PUBLICATIONS

English translation of Written Opinion of the International Searching Authority, dated Aug. 12, 202 for PCT/JP2019/032599 (Year: 2020).*

*Primary Examiner* — Telly D Green
(74) *Attorney, Agent, or Firm* — Best Mode IP Law, PLLC; Yusuke Hirai

(57) ABSTRACT

A semiconductor element bonding structure capable of strongly bonding a semiconductor element and an object to be bonded and relaxing thermal stress caused by a difference in thermal expansion, by interposing metal particles and Ni between the semiconductor element and the object to be bonded, the metal particles having a lower hardness than Ni and having a micro-sized particle diameter. A plurality of metal particles 5 (aluminum (Al), for example) having a lower hardness than nickel (Ni) and having a micro-sized particle diameter are interposed between a semiconductor chip 3 and a substrate 2 to be bonded to the semiconductor chip 3, and the metal particles 5 are fixedly bonded by the nickel (Ni). Optionally, aluminum (Al) or an aluminum alloy (Al alloy) is used as the metal particles 5, and aluminum (Al) or an aluminum alloy (Al alloy) is used on the surface of the semiconductor chip 3 and/or the surface of the substrate 2.

9 Claims, 11 Drawing Sheets

(52) U.S. Cl.
CPC ........ *H01L 23/49582* (2013.01); *H01L 24/05* (2013.01); *H01L 2224/05124* (2013.01); *H01L 2224/27464* (2013.01); *H01L 2224/29247* (2013.01); *H01L 2224/29255* (2013.01); *H01L 2224/29324* (2013.01); *H01L 2224/29355* (2013.01); *H01L 2224/32245* (2013.01); *H01L 2224/8384* (2013.01); *H01L 2224/83091* (2013.01); *H01L 2224/83099* (2013.01); *H01L 2224/83192* (2013.01); *H01L 2224/83395* (2013.01); *H01L 2224/83455* (2013.01); *H01L 2224/83951* (2013.01); *H01L 2924/10272* (2013.01); *H01L 2924/15738* (2013.01); *H01L 2924/15747* (2013.01); *H01L 2924/3512* (2013.01)

(56) References Cited

U.S. PATENT DOCUMENTS

| | | | | |
|---|---|---|---|---|
| 9,922,894 | B1 * | 3/2018 | Viswanathan | H01L 23/047 |
| 10,199,302 | B1 * | 2/2019 | Sanchez | H01L 21/4842 |
| 10,396,006 | B2 * | 8/2019 | Sanchez | H01L 23/49568 |
| 10,529,638 | B2 * | 1/2020 | Sanchez | H01L 21/4825 |
| 2009/0096100 | A1 * | 4/2009 | Kajiwara | H01L 24/33 |
| | | | | 252/512 |
| 2013/0040132 | A1 * | 2/2013 | Nakao | C09J 7/29 |
| | | | | 428/335 |
| 2015/0115452 | A1 * | 4/2015 | Yoon | B23K 1/0016 |
| | | | | 228/256 |
| 2016/0225730 | A1 | 8/2016 | Tatsumi | |
| 2018/0033716 | A1 * | 2/2018 | Viswanathan | B22F 7/04 |
| 2019/0043774 | A1 * | 2/2019 | Sanchez | H01L 23/49541 |
| 2019/0043775 | A1 * | 2/2019 | Sanchez | H01L 21/4842 |
| 2019/0051571 | A1 * | 2/2019 | Sanchez | H01L 21/4839 |
| 2019/0109060 | A1 * | 4/2019 | Sanchez | H01L 21/4839 |

FOREIGN PATENT DOCUMENTS

| | | | | | |
|---|---|---|---|---|---|
| JP | 2014036125 | A | * | 2/2014 | |
| JP | 2014167145 | A | * | 9/2014 | |
| JP | 2014175372 | A | * | 9/2014 | |
| JP | 2014210947 | A | * | 11/2014 | |
| JP | 2015004121 | A | * | 1/2015 | ............ H01L 24/29 |
| JP | 2015004122 | A | * | 1/2015 | |
| JP | 2015141860 | A | * | 8/2015 | |
| JP | 2015198209 | A | * | 11/2015 | |
| JP | 2016058526 | A | * | 4/2016 | |
| JP | 2017-147151 | A | | 8/2017 | |
| JP | 2017-172029 | A | | 9/2017 | |
| JP | 2017172029 | A | * | 9/2017 | |
| JP | 2018-029143 | A | | 2/2018 | |
| JP | 2018-111856 | A | | 7/2018 | |
| WO | WO 2015-053356 | A1 | | 4/2015 | |
| WO | WO-2016002741 | A1 * | | 1/2016 | ............ B22F 1/0014 |
| WO | WO-2016027593 | A1 * | | 2/2016 | ............ B23K 1/012 |
| WO | WO-2016031551 | A1 * | | 3/2016 | ............ C08K 3/08 |
| WO | WO-2016031554 | A1 * | | 3/2016 | ............ C09J 11/04 |

* cited by examiner

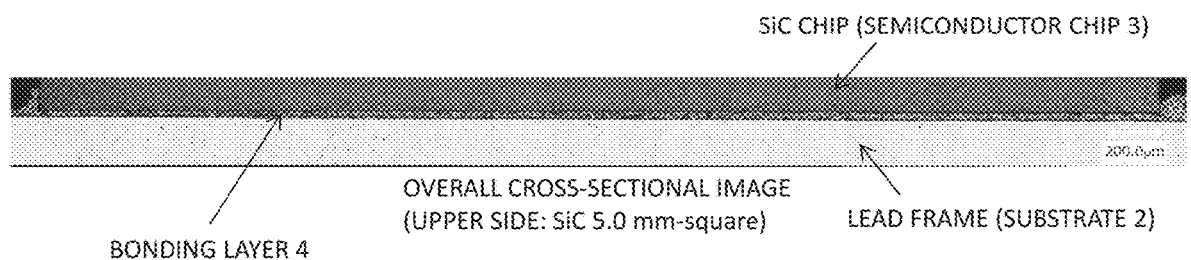
Fig. 5A
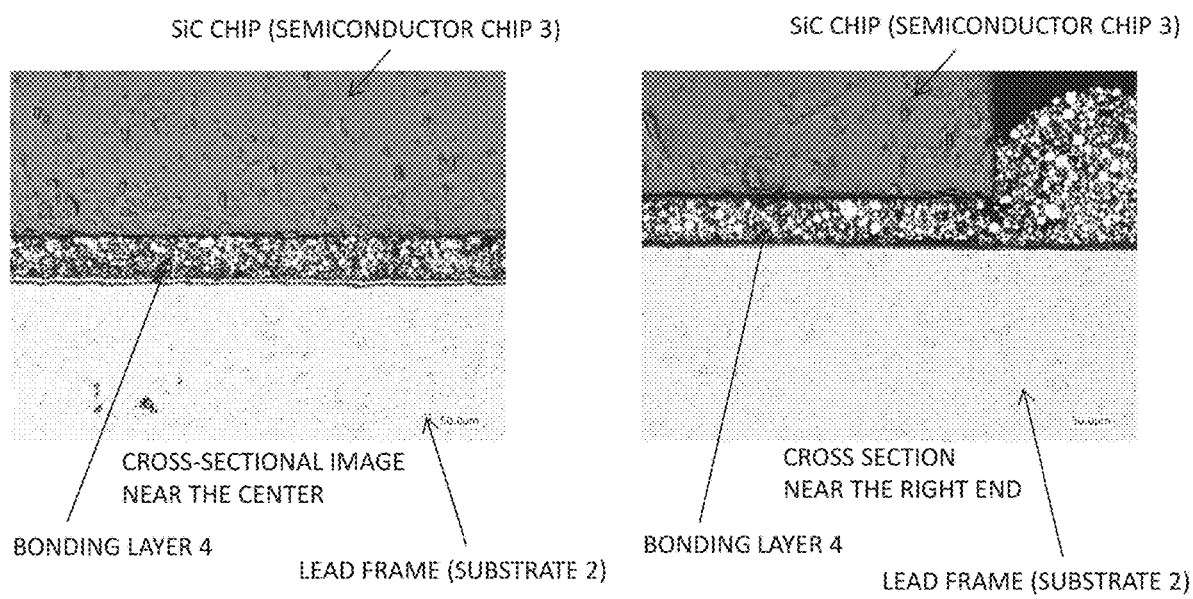
Fig. 5B
Fig. 5C

BONDING ATMOSPHERE: Air
BONDING TEMPERATURE: 400 °C

BONDING STRUCTURE OVERALL CROSS-SECTIONAL IMAGE IN CASE OF ONLY NANO-SIZED Ni PARTICLES
(UPPER SIDE: SiC 5.0 mm-square)

SEMICONDUCTOR ELEMENT BONDING STRUCTURE, METHOD FOR PRODUCING SEMICONDUCTOR ELEMENT BONDING STRUCTURE, AND ELECTRICALLY CONDUCTIVE BONDING AGENT

CROSS-REFERENCE TO RELATED APPLICATIONS

This application is a continuation application of International Patent Application No. PCT/JP2019/032599, filed on Aug. 21, 2019, the disclosure of which is incorporated herein by reference in its entirety. International Patent Application No. PCT/JP2019/032599 is entitled to the benefit of Japanese Patent Application No. 2018-163838, filed on Aug. 31, 2018, the disclosure of which is incorporated herein by reference in its entirety.

FIELD

The present disclosure relates to a bonding structure of a semiconductor element, which is formed by fixedly bonding one metal particles having a relatively low hardness and a micro-sized particle diameter by another metal particles having a face-centered cubic crystal structure.

BACKGROUND

Currently, semiconductors using Si are considered to have an operating temperature of about 150° C. or lower, and compound semiconductors such as SiC and GaN are considered to enable higher temperature operation. If high-temperature operation is enabled, it is possible to operate at a high current density, for example, which is a great advantage especially in power devices. It is expected, for example, that cooling devices for inverters of electric vehicles and hybrid vehicles will be simplified. However, bonding using solder, which is widely used in the current semiconductor mounting technology, has a melting point of two hundred and several tens of Celsius, and it is difficult to use it at or above the melting point. Further, it is known that even if the melting point is equal to or lower than 200° C., a connection failure occur due to thermal stress or the like in long-term use. Therefore, a new high heat resistance mounting technology is required.

As such a mounting technology, bonding technologies such as: melting bonding materials having relatively high melting points such as Au—Ge and Zn—Al alloys; liquid-phase diffusion bonding by diffusion of high melting point and low melting point metals; and sintering bonding of metal nanoparticles have been studied, and among these, various studies on the sintering bonding by metal nanoparticles have been conducted. In this sintering bonding by metal nanoparticles, specific surface area is increased by obtaining metal as nanoparticles to make the surface active, so that bonding can be performed at a relatively low temperature. Further, since the metal will get back to its original melting point after bonding, high heat resistance can be expected as a bonding material.

In recent years, in low-temperature sintering bonding of metal nanoparticles, research and development on metal nanoparticle materials such as silver and copper have been promoted. However, silver is expensive and there is a concern that it may cause problems of oxidation and migration, and copper has a problem of its own oxidation. Further, since a sintered body of metal nanoparticles has a large specific surface area, embrittlement tends to occur at the same time as an increase in yield stress than pure metal due to the uptake of oxygen and carbon atoms to the inside of the sintered body during sintering, which are formed or adsorbed on the surface of the sintered body, and a sufficient stress relaxation effect on thermal stress was not observed.

Therefore, the inventors have conducted studies focusing on Ni particles having a melting point of 1453° C., which is higher than that of silver and copper, and an electrical resistance of $6.99 \times 10^{-8}$ Ωcm, which is relatively low, as shown in Patent Literatures 1 and 2. Note that the electrical resistances of Sn—Pb eutectic solder and lead-free solder (Sn—Ag—Cu), which have been widely used in the past, are $15 \times 10^{-8}$ Ωcm and $11 \times 10^{-8}$ Ωcm, respectively. Further, the coefficient of thermal expansion of Ni is $13.3 \times 10^{-6}$, which is lower than $17 \times 10^{-6}$ of copper and $19 \times 10^{-6}$ of silver, and is closer to the coefficient of thermal expansion of Si and SiC.

It has been known so far that when Ni nanoparticles are used, bonding at 400° C. or lower is possible, and they are a bonding material having heat resistance at 250° C. or higher. Further, it has been revealed that direct bonding with aluminum (hereinafter referred to as Al) is possible, as disclosed in Patent Literature 1. However, it was found that large gas voids and cracks occurred in the bonding layer after sintering. These voids are caused by evaporation of organic matter and the like on the surface of the nanoparticles, and have been a problem in any of the sintered bodies of metal nanoparticles. Further, in the bonding by metal nanoparticles, there is a problem that the stress generated by the difference in a coefficient of thermal expansion (CTE) between a semiconductor element such as Si or SiC and a copper substrate or the like cannot be relaxed, thereby decreasing bonding strength remarkably. Regarding these problems, techniques as shown in Patent Literatures 1 and 2 are disclosed, for example.

The technique shown in Patent Literature 1 provides a bonding structure in which a bonding layer containing metal nanoparticles is formed between a surface to be bonded of a first object to be bonded (a first surface to be bonded) and a surface to be bonded of a second object to be bonded (a second surface to be bonded), and the first surface to be bonded and the second surface to be bonded are bonded by the metal nanoparticles in the bonding. One or both of the first surface to be bonded and the second surface to be bonded comprise Al or an Al alloy, and the metal nanoparticles comprise Ni nanoparticles. By using the Ni nanoparticles as the metal nanoparticles, it is possible to bond the first surface to be bonded and the second surface to be bonded even if one or both of them comprise Al or an Al alloy.

The technique shown in Patent Literature 2 is such that a first bonding layer containing metal nanoparticles, a metal foil layer, and a second bonding layer containing metal nanoparticles are formed in this order between a surface to be bonded of a first object to be bonded (a first surface to be bonded) and a surface to be bonded of a second object to be bonded (a second surface to be bonded), and even if there is a difference in the amount of thermal expansion between the first object to be bonded and the second object to be bonded, it is possible to absorb the difference in the amount of thermal expansion by the deformation of the metal foil layer in the bonding structure, and it is possible to reduce the amount of shear deformation between the first bonding layer and the second bonding layer and prevent a decrease in bonding strength.

CITATION LIST

Patent Literature

Patent Literature 1: Japanese Patent Application Laid-Open No. 2015-9³296
Patent Literature 2: Japanese Patent Application Laid-Open No. 2015-93295

SUMMARY

However, although the technique shown in Patent Literature 1 enables bonding with Al or an Al alloy by including Ni nanoparticles in the bonding layer, Ni is hard, so that thermal stress due to the difference in thermal expansion as described above cannot is relaxed, and there is a possibility that cracks and the like may occur.

Further, although the technique shown in Patent Literature 2 provides the metal foil layer in the bonding structure to enable relaxation of the thermal stress due to the difference in thermal expansion between a chip and a substrate by the deformation of the metal foil layer, it is not possible to relax the difference in thermal expansion between the chip and the substrate that have been bonded by sintering and it is not possible to sufficiently relax thermal stress. Further, due to the provision of the metal foil layer, the number of forming steps for forming a multilayer structure increases, and manufacturing efficiency is reduced.

The present disclosure provides a semiconductor element bonding structure capable of strongly bonding a semiconductor element and an object to be bonded and relaxing thermal stress caused by a difference in thermal expansion, by interposing, between the semiconductor element and the object to be bonded, one metal particles having a relatively low hardness and a micro-sized particle diameter and fixedly bonding the one metal particles by another metal particles having a face-centered cubic crystal structure and a nano size.

The semiconductor element bonding structure according to the present disclosure is a semiconductor element bonding structure including a semiconductor element bonding layer in which a plurality of metal particles of a first metal are fixedly bonded by a second metal, wherein: the first metal has a hardness lower than that of the second metal, a melting point equal to or lower than that of the second metal, and a particle diameter of a micro size; the plurality of metal particles of the first metal are interposed between a semiconductor element and an object to be bonded that is bonded to the semiconductor element; and the plurality of metal particles of the first metal are fixedly bonded by the second metal.

In this way, the semiconductor element bonding structure according to the present disclosure is a semiconductor element bonding structure including a semiconductor element bonding layer in which a plurality of metal particles of a first metal are fixedly bonded by a second metal, wherein: the first metal has a hardness lower than that of the second metal, a melting point equal to or lower than that of the second metal, and a particle diameter of a micro size; the plurality of metal particles of the first metal are interposed between a semiconductor element and an object to be bonded that is bonded to the semiconductor element; and the plurality of metal particles of the first metal are fixedly bonded by the second metal, therefore resulting in such advantageous effects that it is possible to bond the semiconductor element and the object to be bonded strongly and with a high quality by the second metal and, at the same time, it is possible to absorb thermal stress caused by a difference in thermal expansion between the semiconductor element and the object to be bonded by the deformation of the micro-sized metal particles of the first metal, and prevent the occurrence of cracks and the like.

Further, the micro-sized metal particles of the first metal are present in the bonding structure, therefore resulting in such an advantageous effect that it is possible to create a discharge path for a gas generated during sintering, between the metal particles of the first metal, and prevent gas voids from being included therebetween.

BRIEF DESCRIPTION OF DRAWINGS

FIG. 5A is an overall cross-sectional view of a bonding structure observed with an optical microscope in the Example;

FIG. 5B is an cross-sectional image near the center in FIG. 5A;

FIG. 5C is an cross-sectional image near the right end in FIG. 5A;

EMBODIMENTS

Figure 1:
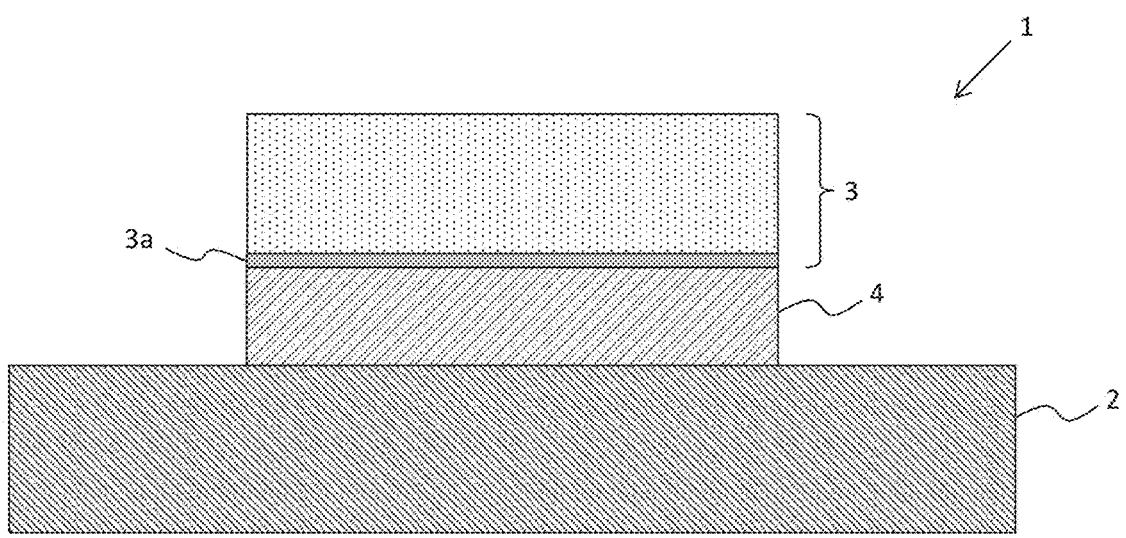
FIG. 1 is a diagram showing a semiconductor element bonding structure according to the First Embodiment.

Hereinafter, an embodiment of the present disclosure will be described. Further, the same reference numerals are given to the same elements throughout the entire embodiment.

First Embodiment

A semiconductor element bonding structure according to the present embodiment will be described with reference to FIG. 1 to FIG. 3. The semiconductor element bonding structure according to the present embodiment is such that first metal particles having relatively low hardness and melting point and a micro-sized particle diameter are fixedly bonded by a second metal having a face-centered cubic crystal structure. Examples of a first metal having relatively low hardness and melting point are aluminum (Al), silver (Ag), zinc (Zn), and copper (Cu). The semiconductor element bonding structure according to the present embodiment has a structure in which a plurality of metal particles of such a first metal and having a micro-sized particle diameter are interposed between a semiconductor element and an object to be bonded that is bonded to the semiconductor element, and the plurality of metal particles of the first metal are fixedly bonded by the second metal having a face-centered cubic crystal structure and having relatively high hardness and melting point.

Of the above metals, Al, for example, has a low hardness and a high stress relaxation effect. Further, Al has excellent high-temperature stability even in an environment where oxygen such as the atmosphere is present, such as a bonding interface with another metal. Therefore, in the present embodiment, a case where Al is mainly used as the first metal will be described. Further, Ni, for example, has relatively high hardness and melting point. Therefore, in the present embodiment, a case where Ni is mainly used as the second metal will be described.

Figure 2:
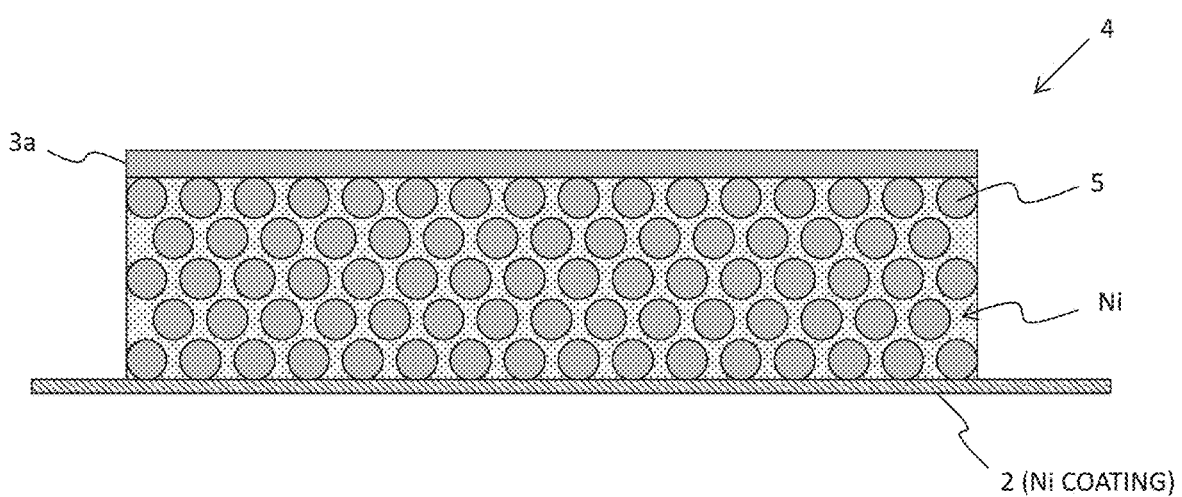
FIG. 2 is an image diagram showing a configuration of a bonding layer in the bonding structure of FIG. 1.

FIG. 1 is a diagram showing a semiconductor element bonding structure according to the present embodiment, and FIG. 2 is an image diagram showing a configuration of a bonding layer in the bonding structure of FIG. 1. The semiconductor element bonding structure 1 according to the present embodiment has a structure in which by interposing a bonding layer 4 between a substrate 2, such as a Cu lead frame whose surface is coated with Ni, for example, and a semiconductor chip 3 of SiC, for example, having an Al electrode 3a as a bonding surface facing the substrate 2, the substrate 2 and the semiconductor chip 3 are bonded.

The bonding layer 4 is formed by fixedly bonding a plurality of metal particles 5 of Al as the first metal, which have a particle diameter of a micro size (hereinafter, the micro size is assumed to be in the range of more than 0.5 μm and less than 1 mm, preferably 500 μm or less), by Ni as the second metal. As shown in Patent Literature 1, Ni enables bonding with Al or an Al alloy, but Ni is hard, so that thermal stress due to the difference in thermal expansion cannot be relaxed, which causes the occurrence of cracks as described above. Therefore, by mixing and interposing the metal particles 5 having a hardness lower than that of Ni and having a micro-sized particle diameter as shown in FIG. 2, it is possible that the metal particles 5 absorb the thermal stress and carry out strong bonding with the Al electrode 3a. Further, in a case of a Cu lead frame coated with Ni, the bonding surface on the substrate 2 side is bonded with Ni, so that it is possible to perform strong bonding by Ni with each other. It should be noted that the outermost surface of the substrate 2 may be gold (Au), Ag, Al, or the like, other than Ni.

Further, since the micro-sized metal particles 5 are present in the bonding layer 4, it is possible to create a discharge path for a gas generated during sintering, between the metal particles 5, and prevent gas voids from being included in the bonding layer 4. Here, in a case where all the micro-sized metal particles 5 have the same diameter, the volume ratio will be about 74% even when they are filled most densely. Therefore, outflow paths of Ni particles and gas are formed in a region between the metal particles 5 (the remaining 26% region of 74%) other than the volume occupied by the metal particle 5, and the outflow paths are dispersed, thereby making it possible to prevent voids from agglomerating in one place for coarsening. In a case where the metal particles 5 have a size distribution, the maximum volume ratio will be 74% or more, but still it is possible to sufficiently secure certain gas outflow paths. That is, even when the metal particles 5 are not filled most densely, it is possible to obtain the stress relaxation effect, and it is also possible to secure the gas outflow paths to contribute the void growth suppressing effect.

Note that it is OK if the micro-sized metal particles 5 interposed in the bonding layer 3 have a hardness lower than that of Ni. For example, Al, Ag, Zn, Cu, and the like can be used as described above. In particular, when Al is used, it is possible to obtain an excellent stress relaxation effect. Further, when the sintering temperature of Ni particles (here, nano-sized Ni particles are used as will be described later) and the heat resistance against heat generation of the semiconductor chip 3 are concerned, it is desirable to use the metal particles 5 having a melting point of at least 300° C. or higher, preferably 350° C. or higher.

Regarding a method for forming the bonding layer 4, the method may be such that a mixture obtained by mixing powdered micro-sized metal particles 5 of the first metal and powdered Ni particles containing Ni having a particle diameter of a nano size (hereinafter, the nano size is assumed to be in the range of 5 nm or more and 500 nm or less) and a particle diameter of 1/10 or less of that of the metal particles 5, is made into a paste, and the resultant paste-like bonding agent is applied to the substrate 2, and the semiconductor chip 3 is placed thereon to perform sintering bonding, for example. Alternatively, the method may be such that a plating solution is circulated between the substrate 2 and the semiconductor chip 3 with the metal particles 5 interposed therebetween, and Ni is precipitated by plating to perform fixedly-bonding between the substrate 2 and the semiconductor chip 3 by the metal particles 5. For example, good bondability with Al particles can be ensured by precipitation of electroless Ni. In either case, a surface layer such as Ni can be formed in advance on the surface of Al particles, for example.

Hereinafter, a method for forming the bonding layer 4 by sintering bonding will be described. FIGS. 3A to 3F are schematic diagrams showing a forming method when the semiconductor element bonding structure according to the present embodiment is formed by sintering binding. First, Ni particles having a nano-sized particle diameter and metal particles 5 having a micro-sized particle diameter (here, assuming that Al particles are used, the metal particles 5 are hereinafter referred to as Al particles) are prepared by the liquid phase reduction method (see FIGS. 3A and 3B). These are mixed with a solvent and a binder to prepare a paste-like bonding material (see FIG. 3C).

Figure 3A:
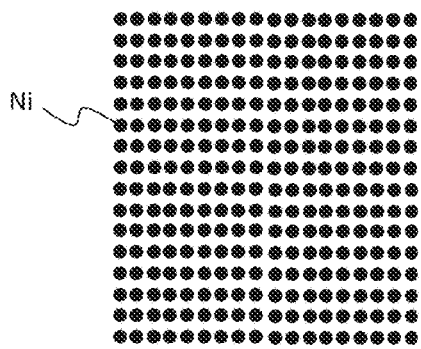
FIGS. 3A to 3F are schematic diagrams showing a forming method when the semiconductor element bonding structure according to the First Embodiment is formed by sintering binding.
Figure 3B:
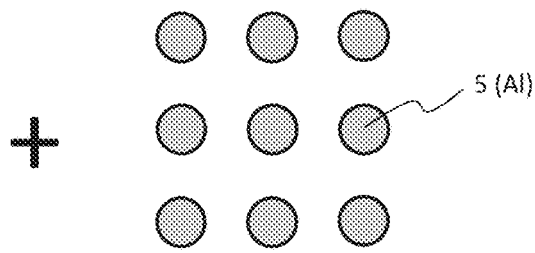
Figure 3C:
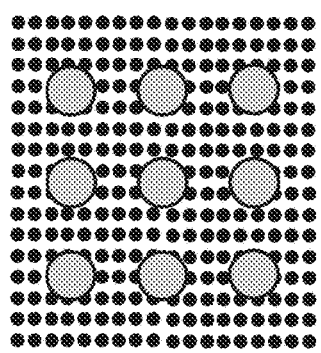
Figures 3D, 3E, 3F:
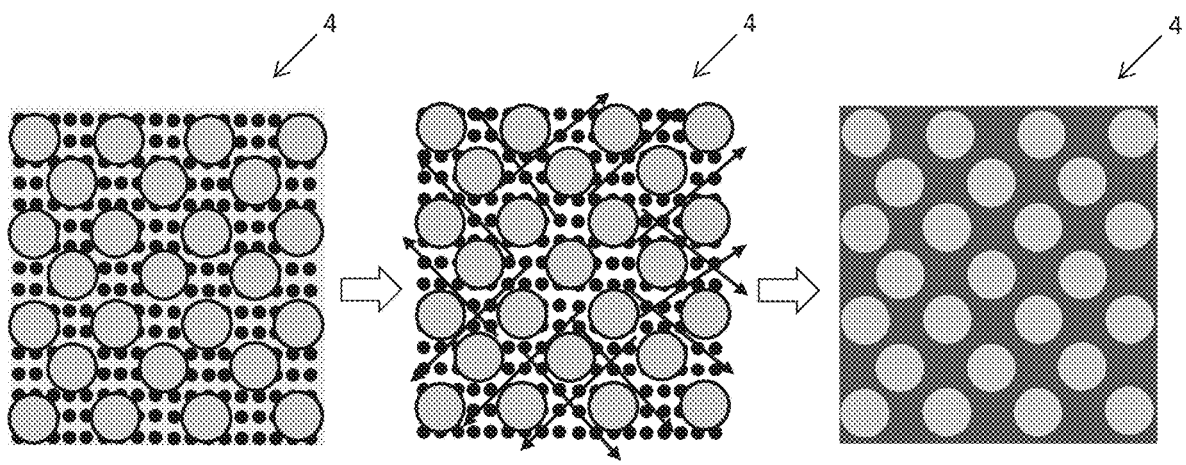

The paste-like bonding material is applied onto the substrate 2, and a semiconductor chip 3 (here, assuming that an SiC power semiconductor is used, the semiconductor chip 3 is hereinafter referred to as an SiC chip) is placed on the resultant substrate (see FIG. 3D; the substrate 2 and the SiC chip are not shown in FIG. 3D). As the bonding conditions, the sintering bonding is performed under a heating rate of 5 (3 to 50) ° C./min, a retention temperature of 350 (300 to 400) ° C., a retention time of 60 (10 to 120) minutes, and a pressurization of 1 (0.5 to 5) MPa, for example. That is, by heating at the above temperatures, the solvent evaporates (see FIG. 3E), and the nano-sized Ni particles are bound by sintering (see FIG. 3F), thereby resulting in that the semiconductor element bonding structure 1 including the bonding layer 4 is formed.

The Ni particles having a nano-sized particle diameter can bind the particles at a temperature (for example, about 300° C.) which is extremely lower than the melting point (1455° C.) of Ni as metal. Further, the metal as a sintered body after binding can maintain the original melting point of Ni, so that it is possible to have sufficient heat resistance against heat generation of the SiC chip.

At this time, it is OK if the particle diameter of the Ni particles is nano-size, but the particle diameter is preferably 500 nm or less, and more preferably 100 nm or less because the sinterability at a low temperature increases. On the other hand, if the particle diameter is too small, the ratios of oxides and organic components on the surface increase, and the bondability decreases. Therefore, the particle diameter of the Ni particles is preferably 5 nm or more. It should be noted that it is not necessary for all of the Ni particles having these particle diameters to satisfy the above size, but it is OK if they contain at least Ni particles having the above size, and preferably the average particle diameter should satisfy the above size.

Further, in the above-mentioned bonding material, the mixing ratio of the Al particles and the Ni particles excluding the solvent and the binder is such that the volume ratio of the Al particles is 20% or more and 90% or less, preferably 50% or more. In doing so, the Al particles form a lattice, and it is possible to suppress coarsening of the voids generated when the Ni particles are sintered. If the volume ratio of the Al particles is 20% or less, the stress relaxation effect is not sufficient, and if it is 90% or more, there are few metal portions to be fixedly bonded, and the bonding force is reduced.

Note that in the semiconductor element bonding structure 1 of FIG. 1, it is desirable for the bonding layer 4 to have a thickness of about 3 to 800 μm. If it is 3 μm or less, sufficient stress relaxation effect cannot be obtained, and if it is 800 μm or more, thermal conductivity decreases significantly, which is not preferable as heat dissipation characteristics. More preferably, it is about 10 μm to 150 μm.

Further, in the present embodiment, it is described using Ni as the second metal, but it is also possible to use nano-sized Cu using the same principle. In this case, it is possible to use Al, Ag, or Zn particles as the metal particles 5 of the first metal having a hardness lower than that of the nano-sized Cu particle sintered body, for example. By mixing these particles of the metal particles 5 of the first metal and the nano-sized Cu particles as the second metal, it is possible to secure stress relaxation and gas outflow paths. Nano-sized particles other than Ni and Cu preferably have a face-centered cubic crystal structure such as Au and Ag, and are suitable for suppressing the generation and growth of cracks on the low temperature side because the degree of deterioration in deformability of the metal after sintering particularly at a low temperature is small. The degree of oxidation of the micro-sized metal particles 5 of the first metal of Al or Ag is suppressed as compared with the case of the nano-sized, and in the case of micro-sized Ag, the concern of migration is also reduced.

EXAMPLES

Figure 4:
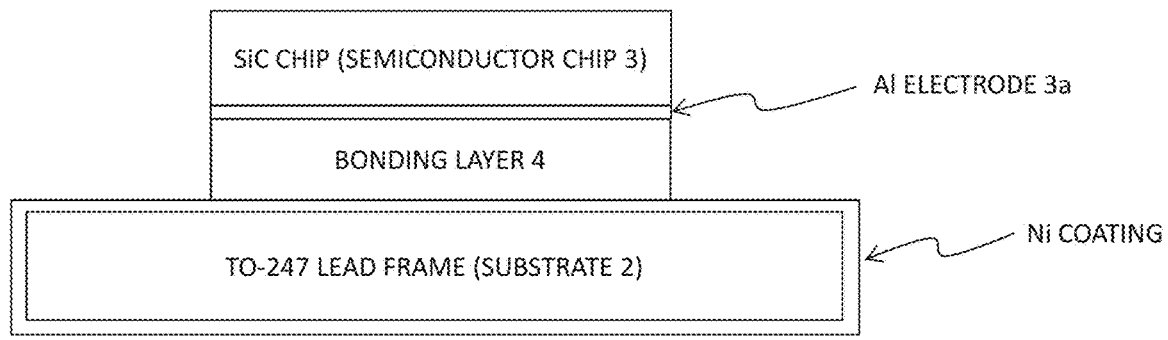
FIG. 4 is a diagram showing a sample structure prepared for an experiment in the Example.

The following experiments on the semiconductor element bonding structure according to the present disclosure were conducted. FIG. 4 is a diagram showing a sample structure prepared for the experiments. Note that in these Examples, the semiconductor element bonding structure was such that the bonding layer 4 in FIG. 1 was formed by sintering a bonding agent in which micro-sized Al particles and nano-sized Ni particles were mixed.

For bonding, a paste composed of nano-sized Ni particles having a particle diameter of 100 nm or less and micro-sized Al particles having an average particle diameter of 10 μm, which were prepared by the liquid phase reduction method, a solvent, and a binder was used as a bonding material. The ratio of the Ni particles to the Al particles in the paste was 1:1 by weight ratio (0.24:0.76 by volume ratio). Note that as a comparison material, a paste containing only nano-sized Ni particles was also used as a bonding material.

For bonding evaluation, a TO-247 lead frame whose surface was subjected to Ni plating and Si chips with sizes of 2.7 mm×2.7 mm, 5.0 mm×5.0 mm, and 7.0 mm×7.0 mm, respectively, were used. An Al electrode having a thickness of 1 μm was formed on the bonding surface of the chips by the vapor deposition method. The paste was applied to the TO-247 lead frame side using a metal mask made of a stainless steel plate having a thickness of 0.1 mm, each chip was placed on the applied part, and bonding was performed under the bonding conditions of a heating rate of 5° C./min, a retention temperature of 350° C., a retention time of 60 minutes, and a pressurization of 1 MPa in the atmosphere. Since the volume ratio of the Al particles was about 76 Vol %, it is considered that the Al particles formed a structure close to the closest packed structure with a filling factor of 74% in the bonding layer.

For measurement of bonding strength, evaluation by shear strength was conducted. A bond tester (universal bond tester 4000Plus manufactured by Nordson Advantage Technology) was used for the measurement, and the measurement was conducted at room temperature. The height of a tool from the test sample was set to 100 μm, and the moving speed of the tool was set to 100 μm/sec. The fracture surface of the sample after the bonding strength test was observed using a scanning electron microscope (SEM, Hitachi High-Technologies: SU3500).

Figure 6:
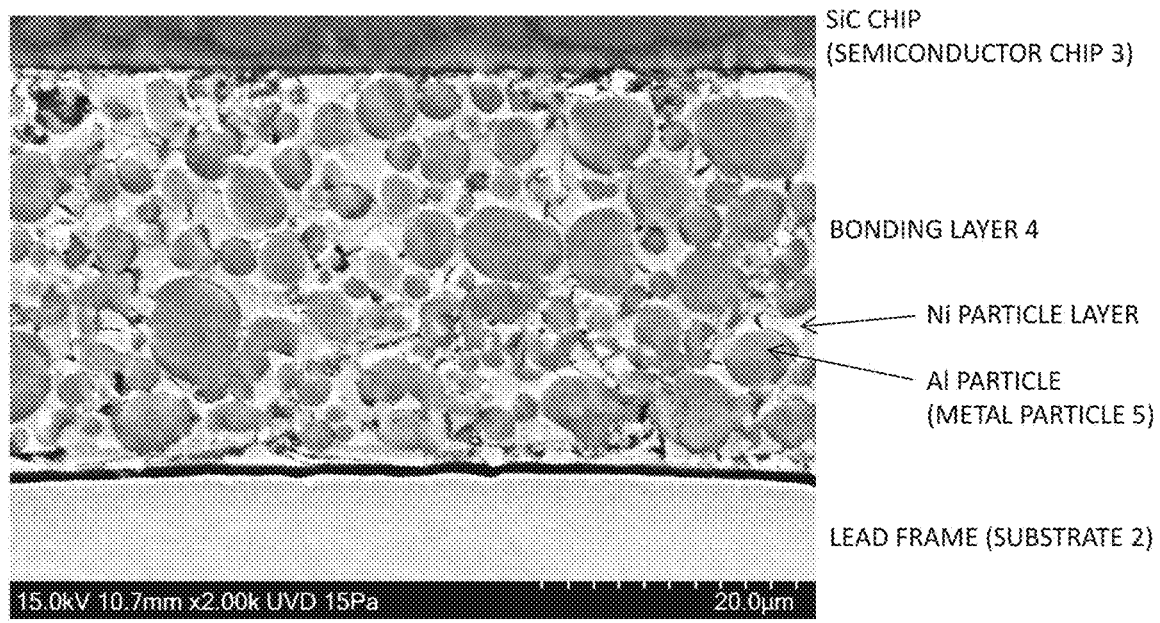
FIG. 6 is an SEM image of a bonding cross section when a bonding material paste in a case where micro-sized Al particles are mixed with nano-sized Ni particles is used in the Example.

Results of the experiments will be described below. The cross section and the surface after bonding were observed. FIG. 5A illustrates an overall cross-sectional view of the bonding structure observed with an optical microscope, and is also a cross-sectional view when the bonding material paste obtained by mixing the micro-sized Al particles with the nano-sized Ni particles was used. FIG. 5B is a cross-sectional image near the center in FIG. 5A. FIG. 5C is a cross-sectional image near the right end in FIG. 5A. Further, FIG. 6 is an SEM image of a bonding cross section when the bonding material paste obtained by mixing the micro-sized Al particles with the nano-sized Ni particles was used.

Figure 11:
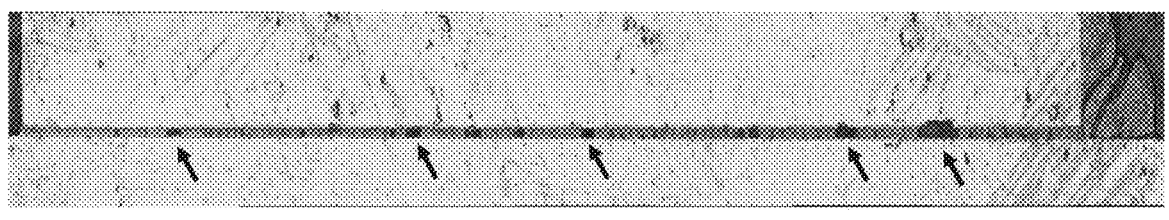
FIG. 11 is an overall cross-sectional view of a bonding structure when low-temperature sintering bonding by nano-sized Ni particles is performed in the past.

When compared with the bonding structure without the micro-sized Al particles as shown in FIG. 11, large cracks and gas voids were observed in the cross-sectional view of FIG. 11, but no large cracks or gas voids were observed in the cross-sectional image of the bonding in FIG. 5 when the paste obtained by mixing the nano-sized Ni particles and the micro-sized Al particles. Further, from the SEM cross-sectional image of FIG. 6, such a situation was confirmed that the Al particles were present while being substantially uniformly dispersed in the sintered Ni particle layer. This is considered to show that since the Al particles form a system of a body-centered cubic lattice or a hexagonal closest packed structure as described above, it was possible to secure paths when the solvent in the bonding process evaporated, and to suppress the generation of large cracks and gas voids.

Figure 7A:
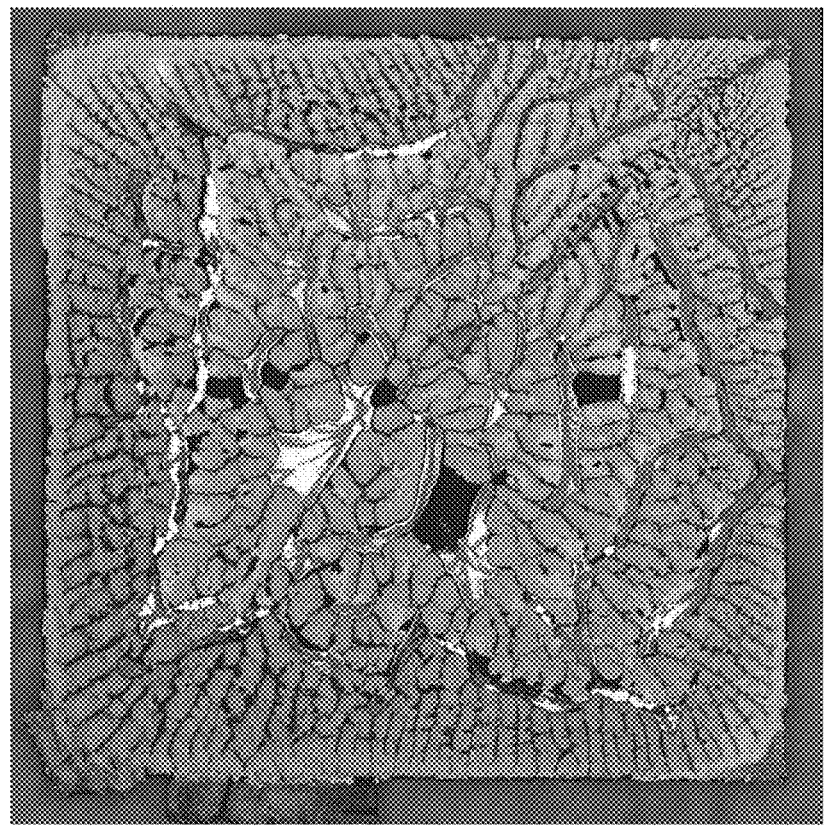
FIGS. 7A and 7B are diagrams showing observation results of surfaces of bonded portions in the Example.
Figure 7B:
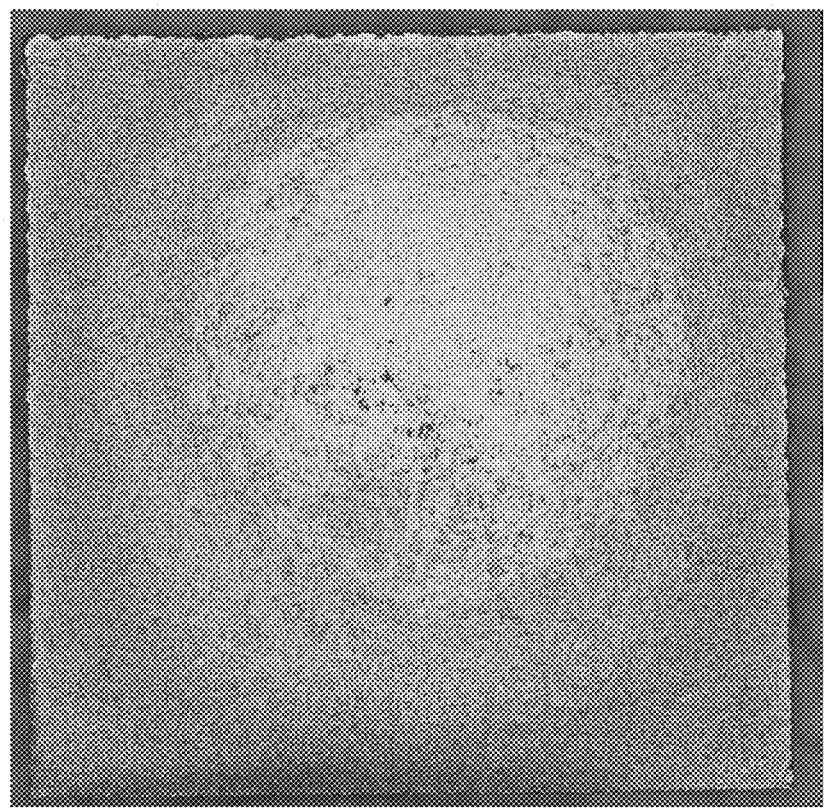

Further, FIGS. 7A and 7B are diagrams showing observation results of surfaces of bonded portions. FIG. 7A is a diagram showing a surface of a bonded portion after heating when the micro-sized Al particles were not contained, and FIG. 7B is a diagram showing a surface of a bonded portion after heating when the micro-sized Al particles were mixed with the nano-sized Ni particles. In FIG. 7A, it was confirmed that large cracks and gas voids were present as a whole in the bonding layer when the Al particles were not contained. In FIG. 7B, it was confirmed that the bonding layer containing the Al particles was a clean layer without large cracks or gas voids. That is, it was confirmed that it was possible to suppress the generation of large cracks and gas voids by securing paths when the solvent in the bonding process evaporated, as described above.

Figure 8:
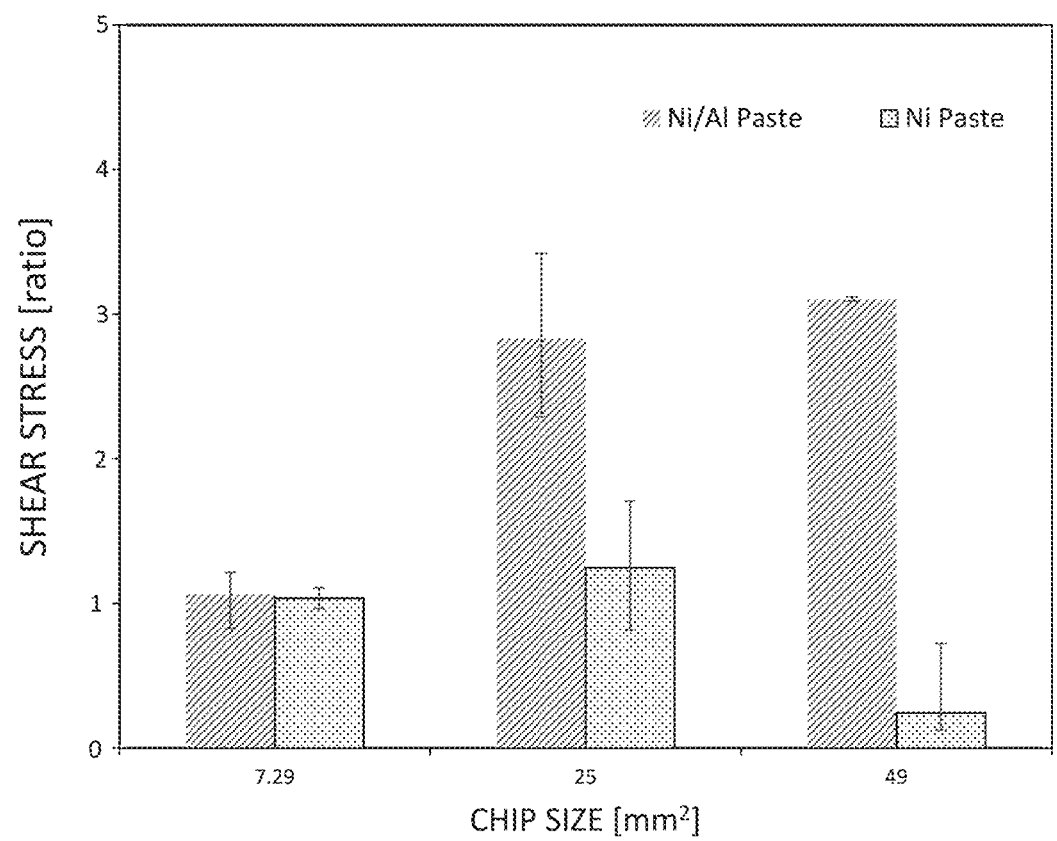
FIG. 8 is a diagram showing a comparison result of an absolute value of share strength by chip size in the Example.

Next, a measurement result of bonding strength will be described. FIG. 8 is a comparison graph of share strength for each chip size. The bonding strength of a 2.7 mm-square chip was set to 1, and the shear stress was compared by chip size between the case where the nano-sized Ni particles and the micro-sized Al particles were mixed and the case where only the nano-sized Ni particles were used. In the small size of 2.7 mm-square, deterioration caused by thermal stress was not remarkable, so that there was almost no difference between the presence and absence of the micro-sized Al particles, but in the mixed paste of the bonding material when the micro-sized Al particles were not contained, the bonding strength decreased, as the chip size increased. On the other hand, in the mixed paste of the bonding material of the nano-sized Ni particles and the micro-sized Al particles, the bonding strength also increased, as the chip size increased.

Coefficient of thermal expansion of a chip increases, as a chip size increases. That is, it is considered that when the micro-sized Al particles were not contained, the thermal stress could not be released, so that the bonding strength decreased, as the chip size increased. On the other hand, it is considered that in the case of the mixed paste of the Ni particles and the Al particles, the Al particles in the bonding layer acted as a release part of the thermal stress, so that high bonding strength was observed.

Figure 9A:
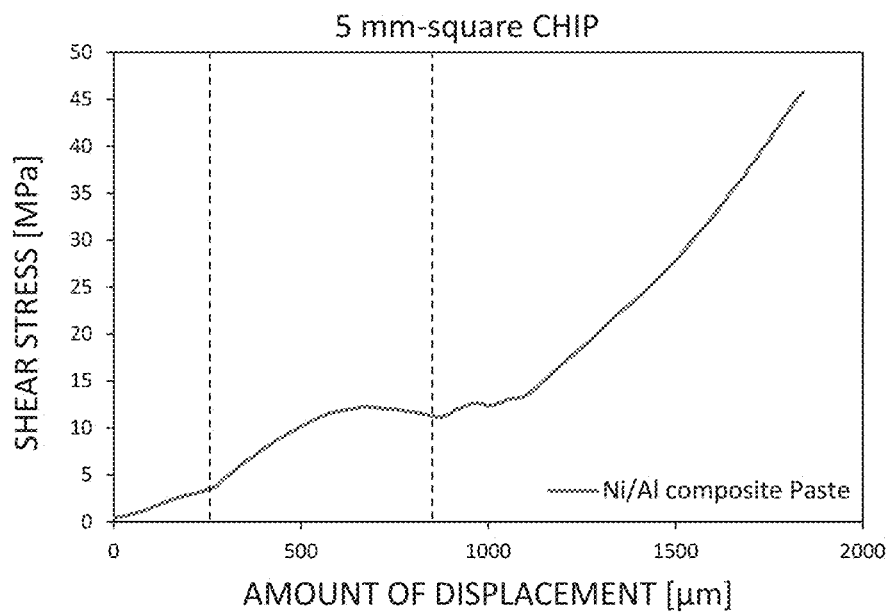
FIGS. 9A and 9B are diagrams showing graphs of a stress-strain curve in which the vertical axis is a bonding strength and the horizontal axis is a tool displacement amount in a direction of shear stress in the Example.
Figure 9B:
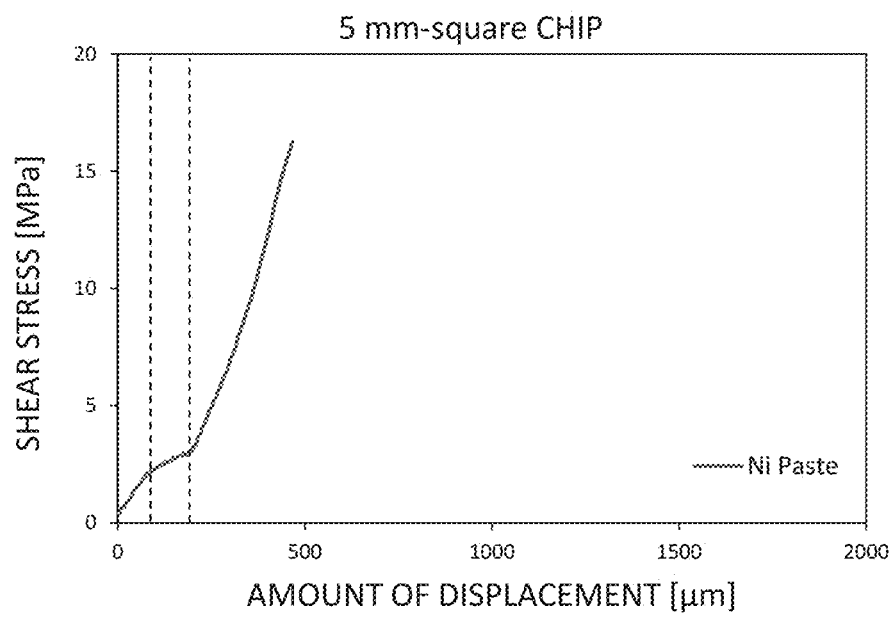

FIGS. 9A and 9B are graphs of a stress-strain curve in which the vertical axis is a bonding strength and the horizontal axis a tool displacement amount in a direction of shear stress. FIG. 9A shows a result of using the bonding material when the micro-sized Al particles were contained, and FIG. 9B shows a result of using the bonding material when the micro-sized Al particles were not contained. Note that FIGS. 9A and 9B were based on the bonding strength results of the chip of 5.0 mm×5.0 mm.

As shown in FIGS. 9A and 9B, the displacement amount of the bonding in which the Al particles were mixed draws a large and gentle curve as compared with that of the bonding in which the Al particles were not mixed. It is considered that this is because the Al particles were elongated and plastically deformed when a shear stress was applied to the Al particles.

Next, with respect to the advantageous effect when the micro-sized Al particles were mixed, thermal stress analysis by the finite element method was performed. The model considered was such that the SiC chip and the Cu substrate were bonded, the chip size was 7.0 mm×7.0 mm, and the bonding surface was Ag. The substrate size was 10.0 mm×10.0 mm. Further, the analysis was performed assuming that the volume ratio of the Al particles in the bonding layer by mixing the nano-sized Ni particles and the micro-sized Al particles was 74%.

Figure 10:
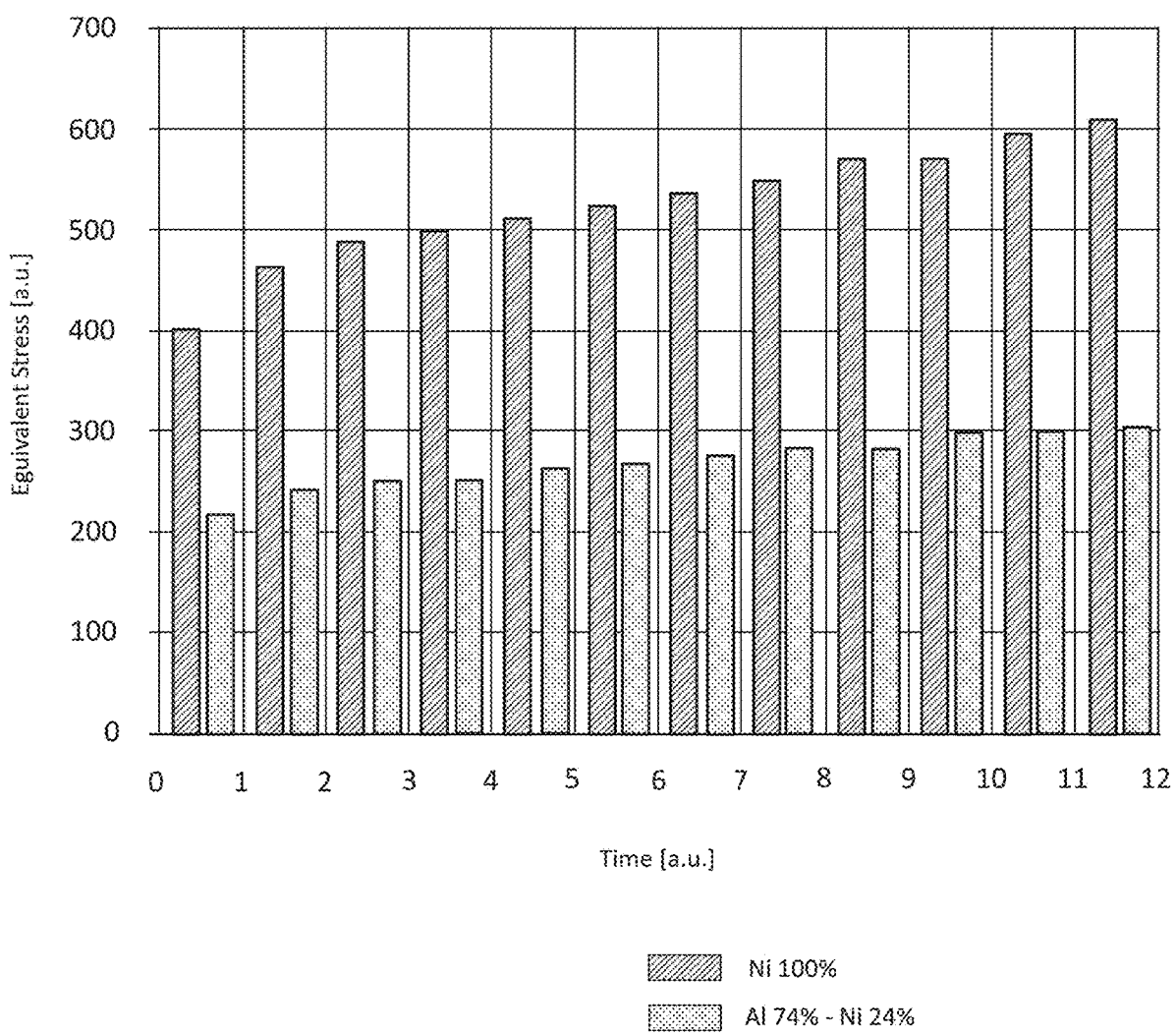
FIG. 10 is a diagram showing a result of a thermal stress analysis by the finite element method in the Example.

The upper and lower limits of the temperature cycle were 250° C. and −45° C., respectively, and the analysis was performed up to 6 times as the number of cycles. The heat cycle started at 200° C., and the temperature was changed from a state in which the thermal stress was released, to the low temperature side and the high temperature side in this order. The maximum generated stress occurs on a chip end surface of the bonded portion, and with respect to the stress in the bonding when the micro-sized Al particles were not contained, the maximum stress increased in any number of cycles compared to the case where the Ni particles and the Al particles were contained. As shown in FIG. 10, it is understood that the stress value of the bonding when the Ni particles and the Al particles were mixed was about ½ lower than the stress value of the bonding when the micro-sized Al particles were not contained.

Further, with respect to a plurality of combinations of metal mixing, the evaluation as shown in Table 1 below was performed under the same conditions as mentioned above. Sintering of the nano-sized metal particles (bound body) is considered to be a bound body because the particles are bound to have a hardness equivalent to that of bulk metal. However, in the actual sintering of the nano-sized metal particles, oxygen, carbon, and the like are often mixed in, and the hardness may increase. In this case, the effect of the present disclosure becomes more remarkable. Note that the maximum temperature of the heat cycle was set to 200° C. In Table 1, circles indicate the results in which the maximum stress was reduced by 20% or more in the case where the micro-sized metal particles were mixed, with respect to the case of 100% nano-sized metal particles for bonding.

TABLE 1

| | Size (μm) | Nano-sized metal/micro-sized metal amount ratio (volume ratio) | Nano-sized metal/micro-sized metal | Result |
|---|---|---|---|---|
| Example | 5 | 26/74 | Ni/Al | ○ |
| | 1 | 26/74 | Ni/Al | ○ |
| | 10 | 26/74 | Ni/Ag | ○ |
| | 5 | 26/74 | Cu/Ag | ○ |
| | 10 | 26/74 | Cu/Al | ○ |
| Comparison | 10 | 26/74 | Zn/Al | × (Micro-sized metal particles have a high melting point) |
| | 10 | 26/74 | Sn/Cu | × (Micro-sized metal particles have a high melting point) |

From Table 1, it has been revealed that even the combinations of metal particles of Ni/Ag, Cu/Ag, and Cu/Al (nano-sized metal/micro-sized metal), other than the mixing of nano-sized Ni/micro-sized Al, can obtain the advantageous effects of the present disclosure.

Next, an experiment to fixedly bond micro-sized Al with Ni by plating was conducted. Particles in which 0.3 μm Ni was coated by electroless Ni plating on the surface of Al particles having an average particle diameter of 150 μm were prepared, and the Al particles were sandwiched between a 5 mm-square SiC chip having an electrode surface of Ni and a Ni-plated Cu substrate so as to have a thickness of 500 μm, to fix the SiC chip and the Cu substrate. At this time, permanent magnets were arranged on both sides of the SiC chip and the Cu substrate to fix them by using the magnetic property of Ni. A Ni plating solution was circulated in voids of the Al particles, and the particles were fixedly bonded by electroplating. Observing from the cross section, the cross section occupancy of Al was about 70%, and the cross section occupancy of the fixed portion by plating was 12%.

That is, it is possible to strongly fixedly bond the micro-sized metal particles by the plated metal, and it is possible to absorb thermal stress by yield (plastic deformation) of the micro-sized metal particles.

From the above experimental results, it has been revealed that it is possible to suppress the generation of large cracks and gas voids that have occurred in the bonding structure in which the micro-sized Al particles are not contained, by mixing the micro-sized Al particles with the nano-sized Ni particles. Further, the bonding in which the mixed paste of Ni and Al particles were used did not show a decrease in bonding strength as compared with the bonding in which the Al particles were not contained, so that it has been revealed that good bonding was made between the Ni particles and the Al particles after sintering of the Ni particles. Furthermore, from the above experimental results, the tendency of plastic deformation of the Al particles that was present while dispersed in the Ni particle layer was observed, and also from the fracture surface observation after the share test, such a situation was confirmed that the Al particles were elongated and plastically deformed. Therefore, it has been revealed that the semiconductor element bonding structure according to the present disclosure makes it possible to bond the semiconductor element and the object to be bonded strongly and with a high quality by Ni and, at the same time, makes it possible to absorb thermal stress caused by a difference in thermal expansion between the semiconductor element and the object to be bonded by yield (plastic deformation) of the metal particles, and prevent the occurrence of cracks and the like.

Further, it has been revealed that it is possible to realize a semiconductor element bonding structure having the advantageous effects of the present disclosure by forming a bonding structure by mixing, with nano-sized metal particles having a face-centered cubic crystal structure, micro-sized metal particles having a hardness lower than that of the metal particles and having a melting point equal to or less than that of the metal particles, other than the mixing of nano-sized Ni/micro-sized Al.

REFERENCE SIGNS LIST

1 Semiconductor element bonding structure
2 Substrate
3 Semiconductor chip
3a Al electrode
4 Bonding layer
Metal particle

What is claimed is:

1. A semiconductor element bonding structure comprising:
   a semiconductor element bonding layer in which a plurality of metal particles of a first metal are fixedly bonded by a second metal, wherein:
      the first metal has a hardness lower than that of the second metal, a melting point equal to or lower than that of the second metal, and a particle diameter of a micro size;
      the plurality of metal particles of the first metal are interposed between a semiconductor element and an object that is bonded to the semiconductor element;
      the first metal is aluminum (Al) or an aluminum alloy (Al alloy) and the second metal is nickel (Ni); and
      a volume ratio of the plurality of metal particles of the first metal ranges from 50% to 90% of a total volume of the plurality of metal particles of the first metal and the second metal.

2. The semiconductor element bonding structure according to claim 1, wherein: the particle diameter of the metal particles of the first metal is larger than 0.5 µm and smaller than or equal to 500 µm.

3. The semiconductor element bonding structure according to claim 1, wherein: the semiconductor element bonding layer has a thickness ranging from 3 µm to 800 µm.

4. A method for producing a semiconductor element bonding structure according to claim 1, the method comprising:
   interposing the plurality of metal particles of the first metal between the semiconductor element and the object to be bonded;
   circulating a plating solution in a gap formed between the metal particles of the first metal; and
   precipitating the second metal by a plating process, whereby the metal particles of the first metal are fixedly bonded to the semiconductor element bonding layer.

5. A method for producing a semiconductor element bonding structure according to claim 1, the method comprising:
   heating a mixture of metal particles of the second metal and the metal particles of the first metal at a temperature of 200° C. or higher, the metal particles of the second metal having a particle diameter ranging from 5 nm to 500 nm and a particle diameter of 1/10 or less than that of the metal particles of the first metal; and
   fixedly bonding the metal particles of the first metal by a sintered body of the metal particles of the second metal to the semiconductor element bonding layer.

6. An electrically conductive bonding agent comprising:
   a mixture of nickel (Ni) particles containing nano-sized nickel (Ni) and metal particles having a hardness lower than that of nickel (Ni) and having a particle diameter of micro size,
   wherein a volume ratio of the metal particles ranges from 50% to 90% of a total volume of the metal particles and the nickel (Ni) particles.

7. The electrically conductive bonding agent of claim 6, further comprising a solvent and a binder.

8. The electrically conductive bonding agent of claim 6, wherein the metal particles are aluminum (Al) particles or aluminum alloy (Al alloy) particles.

9. The electrically conductive bonding agent of claim 6, wherein the particle diameter of the metal particles is larger than 0.5 µm and smaller than or equal to 500 µm.

* * * * *